US010312357B2

(12) United States Patent
 Kanda et al.

(10) Patent No.: US 10,312,357 B2
(45) Date of Patent: Jun. 4, 2019

(54) TRENCH GATE IGBT

(71) Applicant: Renesas Electronics Corporation, Tokyo (JP)

(72) Inventors: Ryo Kanda, Tokyo (JP); Hitoshi Matsuura, Hitachinaka (JP); Shuichi Kikuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/798,218

(22) Filed: Oct. 30, 2017

(65) Prior Publication Data

US 2018/0182875 A1    Jun. 28, 2018

(30) Foreign Application Priority Data

Dec. 22, 2016   (JP) ................. 2016-249360

(51) Int. Cl.
 *H01L 29/739*  (2006.01)
 *H01L 29/40*   (2006.01)
 *H01L 29/06*   (2006.01)
 H01L 29/423    (2006.01)

(52) U.S. Cl.
 CPC ...... *H01L 29/7397* (2013.01); *H01L 29/0619* (2013.01); *H01L 29/0692* (2013.01); *H01L 29/407* (2013.01); *H01L 29/4238* (2013.01)

(58) Field of Classification Search
 CPC ............ H01L 29/0696; H01L 29/1095; H01L 29/66325; H01L 29/7393; H01L 29/7395; H01L 29/7397; H01L 2924/13055
 See application file for complete search history.

(56) References Cited

U.S. PATENT DOCUMENTS

| 9,653,587 B2 | 5/2017 | Matsuura |
| 2004/0084722 A1 | 5/2004 | Yamaguchi et al. |
| 2009/0283797 A1 | 11/2009 | Takahashi et al. |
| 2011/0233684 A1* | 9/2011 | Matsushita ......... H01L 29/1095 |
| | | 257/378 |

FOREIGN PATENT DOCUMENTS

| EP | 2 942 816 A1 | 11/2015 |
| JP | 2013-140885 A | 7/2013 |

OTHER PUBLICATIONS

Extended European Search Report dated Apr. 25, 2018 in European Application No. 17200776.7.

* cited by examiner

*Primary Examiner* — Moin M Rahman
(74) *Attorney, Agent, or Firm* — McGinn IP Law Group, PLLC

(57) ABSTRACT

A high-performance trench gate IGBT is provided. A trench gate IGBT according to one embodiment includes: a semiconductor substrate (11); a channel layer (15) provided on the semiconductor substrate (11); two floating P-type layer (12) provided on both sides of the channel layer 15, the floating P-type layers (12) being deeper than the channel layer (15); two emitter trenches (13) disposed between the two floating P-type layers (12), the emitter trenches (13) being respectively in contact with the floating P-type layers (12); at least two gate trenches (14) disposed between the two emitter trenches (13); and a source diffusion layer (19) disposed between the two gate trenches 14, the source diffusion layer (19) being in contact with each of the gate trenches (14).

15 Claims, 5 Drawing Sheets

TRENCH GATE IGBT

CROSS-REFERENCE TO RELATED APPLICATIONS

This application is based upon and claims the benefit of priority from Japanese patent application No. 2016-249360, filed on Dec. 22, 2016, the disclosure of which is incorporated herein in its entirety by reference.

BACKGROUND

The present invention relates to a trench gate IGBT.

Japanese Unexamined Patent Application Publication No. 2013-140885 discloses a trench gate IGBT (Insulated Gate Bipolar Transistor). An IGBT illustrated in FIG. 31 of Japanese Unexamined Patent Application Publication No. 2013-140885 includes a trench gate disposed between P-type floating regions.

SUMMARY

There is a demand for further improving the performance of such a trench gate IGBT.

Other problems to be solved by and novel features of the present invention will become apparent from the following description and the accompanying drawings.

According to one embodiment, a trench gate IGBT includes two floating layers, two emitter trenches disposed between the two floating layers so as to be in contact with the floating layers, and at least two gate trenches disposed between the two emitter trenches.

According to the one embodiment, it is possible to provide a high-performance trench gate IGBT.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
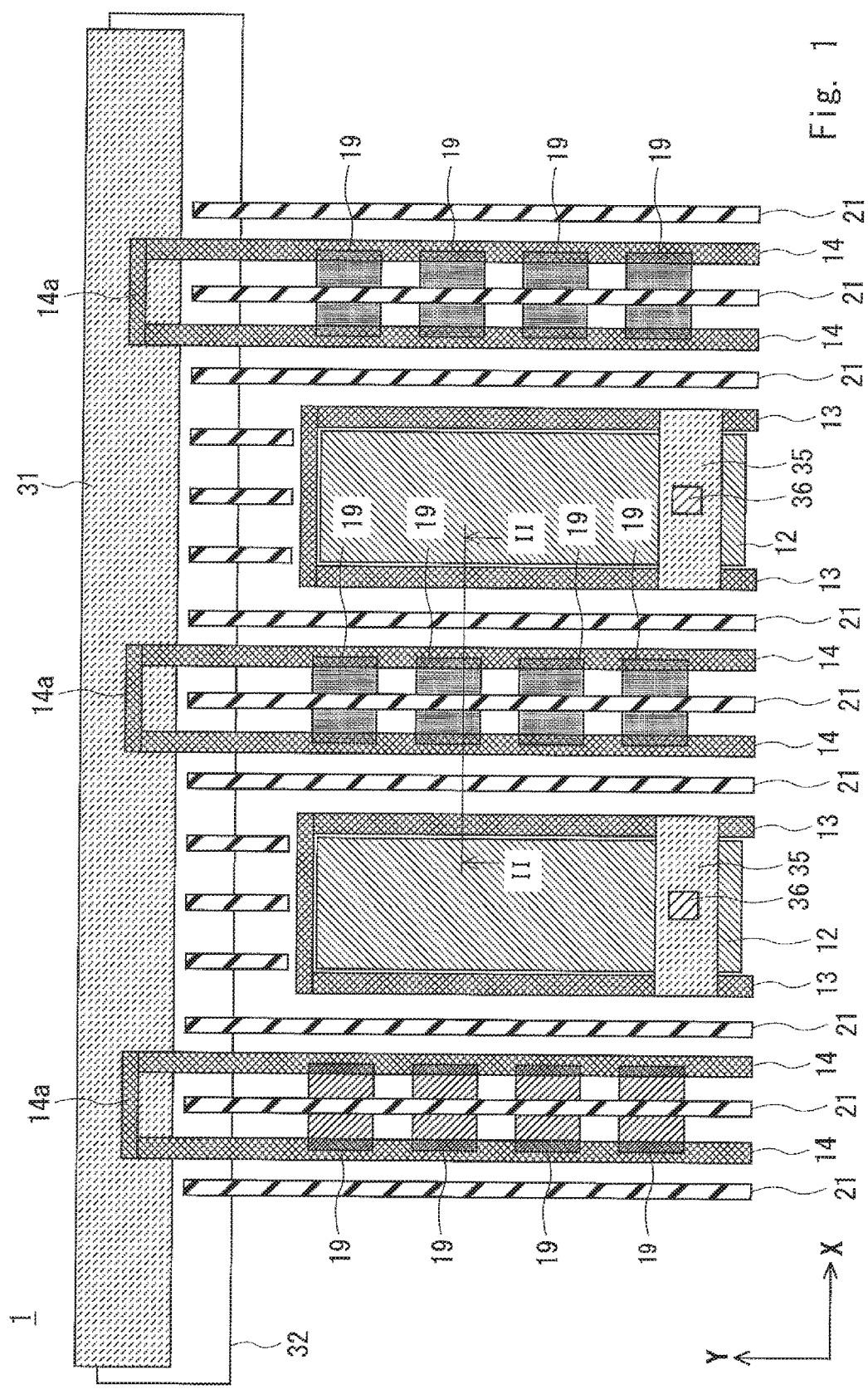
FIG. 1 is a plan view schematically showing a configuration of an IGBT according to a first embodiment.

The following description and drawings are omitted and simplified as appropriate for clarification of the explanation. The same elements are denoted by the same reference numerals throughout the drawings, and repeated explanations are omitted as necessary.

First, a trench gate IGBT (Insulated Gate Bipolar Transistor) disclosed in Japanese Unexamined Patent Application Publication No. 2013-140885 will be described. The trench gate IGBT (hereinafter also referred to simply as IGBT) disclosed in Japanese Unexamined Patent Application Publication No. 2013-140885 includes a P-type floating region (also referred to as a floating P-type layer; hereinafter referred to as an FLP layer). A collector-emitter voltage Vce (sat) can be reduced by enhancing a carrier storage effect.

Further, an IGBT shown in FIG. 31 of Japanese Unexamined Patent Application Publication No. 2013-140885 includes a trench connected to a metal emitter electrode (the trench is hereinafter referred to as an emitter trench), and a trench connected to a metal gate electrode (the trench is hereinafter referred to as a gate trench). The gate trench is disposed between two emitter trenches. Specifically, an emitter trench, a gate trench, and an emitter trench are disposed in this order between two FLP layers. With this structure (hereinafter referred to as an EGE structure), a feedback capacitance Cres can be reduced, which leads to an improvement in switch characteristics.

In the trench gate IGBT disclosed in Japanese Unexamined Patent Application Publication No. 2013-140885, the collector-emitter voltage Vce (sat) can be reduced and the switch characteristics can be improved. Note that the FLP layer is deeper than the trenches. This is intended to relax the electric field at a bottom end of each trench, to thereby improve a robustness BVces. Since the FLP layer is shallow, if the width of the FLP layer is wide, the robustness BVces decreases. To be more specific, it is important to reduce the feedback capacitance Cres with respect to an input capacitance Cies.

In the trench gate IGBT shown in FIG. 31 of Japanese Unexamined Patent Application Publication No. 2013-140885, the occupancy of the gate trenches is smaller than that of a typical cell. This causes problems that the input capacitance Cies decreases and the IGBT is likely to be affected by noise, and the ESD (ElectroStatic Discharge) tolerance decreases. These problems become more serious in a product with a small current band (i.e., with a small chip size).

The trench gate IGBT according to this embodiment has been devised to accomplish both an improvement in characteristics and an improvement in noise resistance and ESD tolerance. The trench gate IGBT according to this embodiment is especially effective for a small current application. As for the basic configuration of the trench gate IGBT according to this embodiment and a manufacturing method thereof, see the contents disclosed in Japanese Unexamined Patent Application Publication No. 2013-140885, as necessary.

First Embodiment

Figure 2:
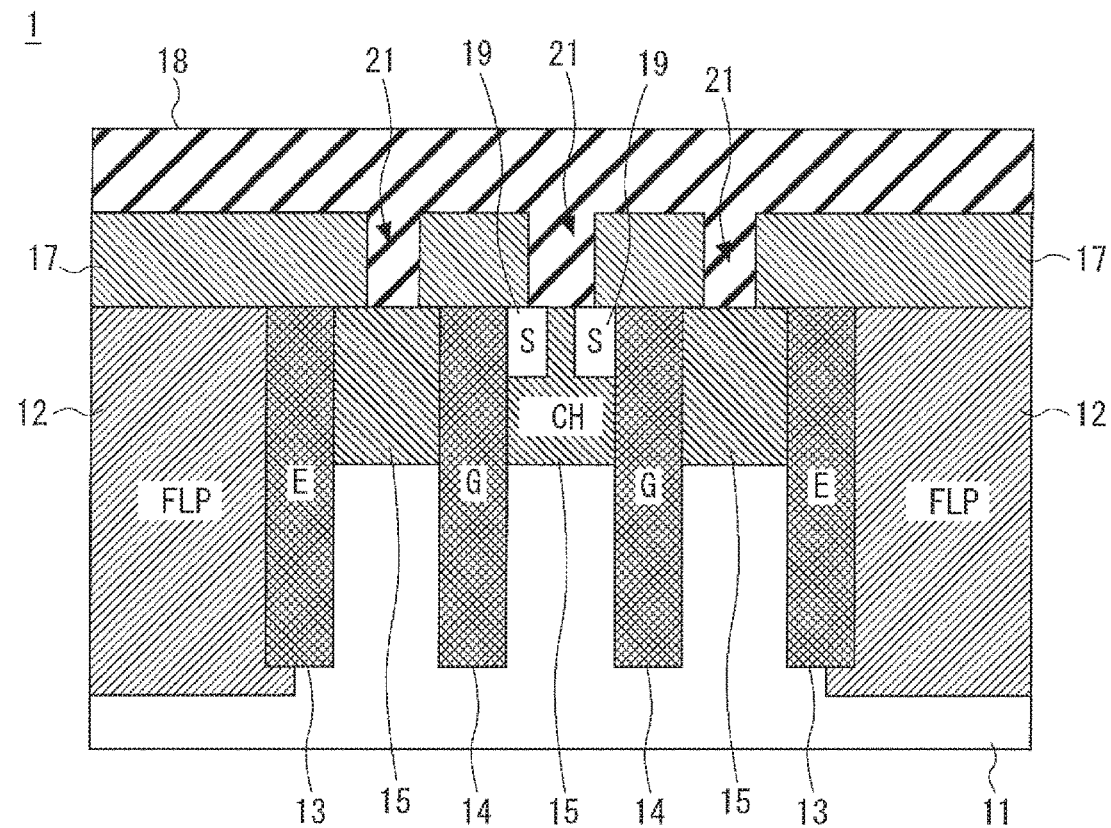
FIG. 2 is a sectional view schematically showing the configuration of the IGBT according to the first embodiment.

A trench gate IGBT according to a first embodiment will be described with reference to FIGS. 1 and 2. FIG. 1 is a plan view schematically showing a configuration of a major part of a cell of a trench gate IGBT 1 (hereinafter simply referred to as IGBT 1). FIG. 2 shows a sectional view taken along a line II-II shown in FIG. 1, and shows a configuration between two adjacent floating P-type layers 12. In the drawings, the thickness direction (depth direction) of a semiconductor substrate 11 is defined as a Z-direction and a plane perpendicular to the Z-direction is defined as an XY plane, for clarity of explanation. In the XY plane, the Y-direction corresponds to the longitudinal direction of a linear gate trench 14, which is described below, and an X-direction corresponds to the short-axis direction of the gate trench 14. The X-direction and the Y-direction are perpendicular to each other.

The IGBT 1 includes a semiconductor substrate 11, floating P-type layers (hereinafter referred to as FLP layers) 12, emitter trenches 13, gate trenches 14, channel layers 15, an insulating film 17, an emitter electrode 18, source diffusion layers 19, contacts 21, a gate electrode 31, a P-type well 32, and contacts 36.

The semiconductor substrate 11 is, for example, a silicon single crystal wafer and is used as an N-type substrate in which an impurity such as phosphorus (P) is introduced. On the semiconductor substrate 11, the FLP layers 12, the emitter trenches 13, the gate trenches 14, and the channel layers 15 are formed. Above the semiconductor substrate 11, the insulating film 17 and the emitter electrode 18 are formed. Although not shown, the back surface of the semiconductor substrate 11 serves as a p-type collector.

Each FLP layer 12 is a P-type well in which an impurity such as boron is introduced. The potential of the FLP layer 12 is floating. As shown in FIGS. 1 and 2, the cell is provided with two floating P-type layers 12. The two FLP layers 12 are provided so as to be spaced apart from each other in the X-direction. Each of the FLP layers 12 has a rectangular shape in the XY plane view.

As shown in FIG. 2, two emitter trenches 13 are provided between two adjacent FLP layers. The two emitter trenches 13 are provided so as to be spaced apart from each other in the X-direction. Each emitter trench 13 is disposed in contact with the corresponding FLP layer 12. Specifically, one of the two emitter trenches 13 (e.g., the +X-side emitter trench 13) is in contact with one of the two FLP layers 12 (e.g., the +X-side FLP layer 12), and the other one of the two emitter trenches 13 (e.g., the -X-side emitter trench) is in contact with the other one of the two FLP layers 12 (e.g., the -X-side FLP layer 12).

In the XY plan view shown in FIG. 1, the FLP layers 12 are each formed into a rectangular shape. In the XY plane view, the emitter trenches 13 are each formed into a U-shape. In the XY plane view, each emitter trench 13 having a U-shape is in contact with three sides of the rectangular FLP layer 12. The FLP layer 12 is deeper than the emitter trench 13. With this configuration, the electric field at a trench bottom end can be relaxed and the robustness BVces can be improved.

Further, as shown in FIG. 1, polysilicon electrodes 35 are formed on the FLP layers 12, respectively. In the X-direction, the polysilicon electrodes 35 are each formed so as to straddle the corresponding FLP layer 12. Accordingly, ends in the X-direction of each polysilicon electrode 35 are formed on the emitter trenches 13, respectively.

Each polysilicon electrode 35 is connected to the emitter trenches 13 so as to obtain an emitter potential. Each polysilicon electrode 35 is formed of, for example, a polysilicon film. The contact 36 is formed on the polysilicon electrode 35. Each contact 36 is in contact with the corresponding polysilicon electrode 35. Accordingly, each contact 36 is connected to the emitter trenches 13 through the corresponding polysilicon electrode 35. The emitter trenches 13 are each connected to the emitter potential through the corresponding contact 36.

As shown in FIG. 2, two gate trenches 14 are disposed between the two emitter trenches 13. The two gate trenches 14 are disposed so as to be separated from each other in the X-direction.

As shown in FIG. 1, the gate trenches 14 are linear trenches whose longitudinal direction corresponds to the Y-direction. In the XY plane view, the gate trench 14 extends in the Y-direction from the position between the two emitter trenches 13 to the position overlapping the gate electrode 31. In other words, an end in the +Y-direction of each gate trench 14 overlaps the gate electrode 31.

Further, at an end in the +Y-direction of each gate trench 14, two gate trenches 14 are connected through a gate trench 14a. The gate trenches 14 are supplied with a gate potential through the gate electrode 31. The gate electrode 31 is formed of, for example, the polysilicon film with which each polysilicon electrode 35 is formed. The gate electrode 31 is formed on the P-type well 32.

Note that the gate trenches 14 each include, for example, a gate oxide film formed on an inner surface the trench, and a silicon film buried in the trench. Each emitter trench 13 can be formed by a process similar to that for forming the gate trenches 14.

Further, as shown in FIG. 2, the channel layers 15 are each formed on the surface of the semiconductor substrate 11. Each channel layer 15 is disposed between two emitter trenches 13. Each channel layer 15 is a P+-type well in which an impurity such as boron is introduced. Each channel layer 15 is a well that is shallower than the FLP layer 12. In other words, the FLP layer 12 is formed at a location deeper than the channel layer 15.

The insulating film 17 is formed above the semiconductor substrate 11. The insulating film 17 is, for example, a silicon oxide film. The emitter electrode 18 is formed on the insulating film 17. The emitter electrode 18 can be formed of the polysilicon film with which each polysilicon electrode 35 is formed. The insulating film 17 includes the contacts 21. The emitter electrode 18 is buried in each contact 21. Specifically, the emitter electrode 18 is connected to the channel layers 15 through each contact 21 which is formed in the insulating film 17. Like in the XY plane vies shown in FIG. 1, each contact 21 is linearly formed with the Y-direction corresponding to the longitudinal direction thereof.

Further, the source diffusion layers 19 of an FET (Field Effect Transistor) are formed between the two gate trenches 14. The source diffusion layers 19 are each formed on the surface of each channel layer 15 of the semiconductor substrate 11. The source diffusion layers 19 are each in contact with the gate trenches 14. Each source diffusion layer 19 is an N+-type emitter diffusion layer, and is connected to the emitter potential through each contact 21.

In this manner, two gate trenches 14 are disposed between the two emitter trenches 13. The IGBT 1 has a structure (hereinafter referred to as an EGGE structure) in which the emitter trench 13, the gate trench 14, the gate trench 14, and the emitter trench 13 are disposed in this order between two adjacent FLP layers 12 in the X-direction. In the EGGE structure, two emitter trenches 13 are disposed between two FLP layers 12, and at least two gate trenches 14 are disposed between two emitter trenches 13.

By the EGGE structure, the occupancy of the gate trenches 14 can be increased while the advantages of the EGE structure are maintained. Accordingly, the input capacitance Cies can be increased. This leads to an improvement in noise tolerance and ESD tolerance. This is more effective in the application of, for example, a low current with a small chip size. In particular, the IGBT 1 is suitable for an inverter for a small current application.

The number of the gate trenches 14 disposed between the two emitter trenches 13 is not limited to two, but instead three or more gate trenches 14 may be disposed between the two emitter trenches 13. In the EGGE structure, a plurality of gate trenches 14 are disposed, which provides controllability for a capacitance value and a current density. By the floating structure, the collector-emitter voltage Vce (sat) can be reduced. Each emitter trench 13 prevent the FLP layers 12 from coming into contact with the gate trenches 14. In other words, each emitter trench 13 is interposed between the gate trench 14 and the FLP layer 12. Accordingly, flexibility of design can be obtained while the effect of reducing the feedback capacitance Cres is maintained.

First Modified Example

Figure 3:
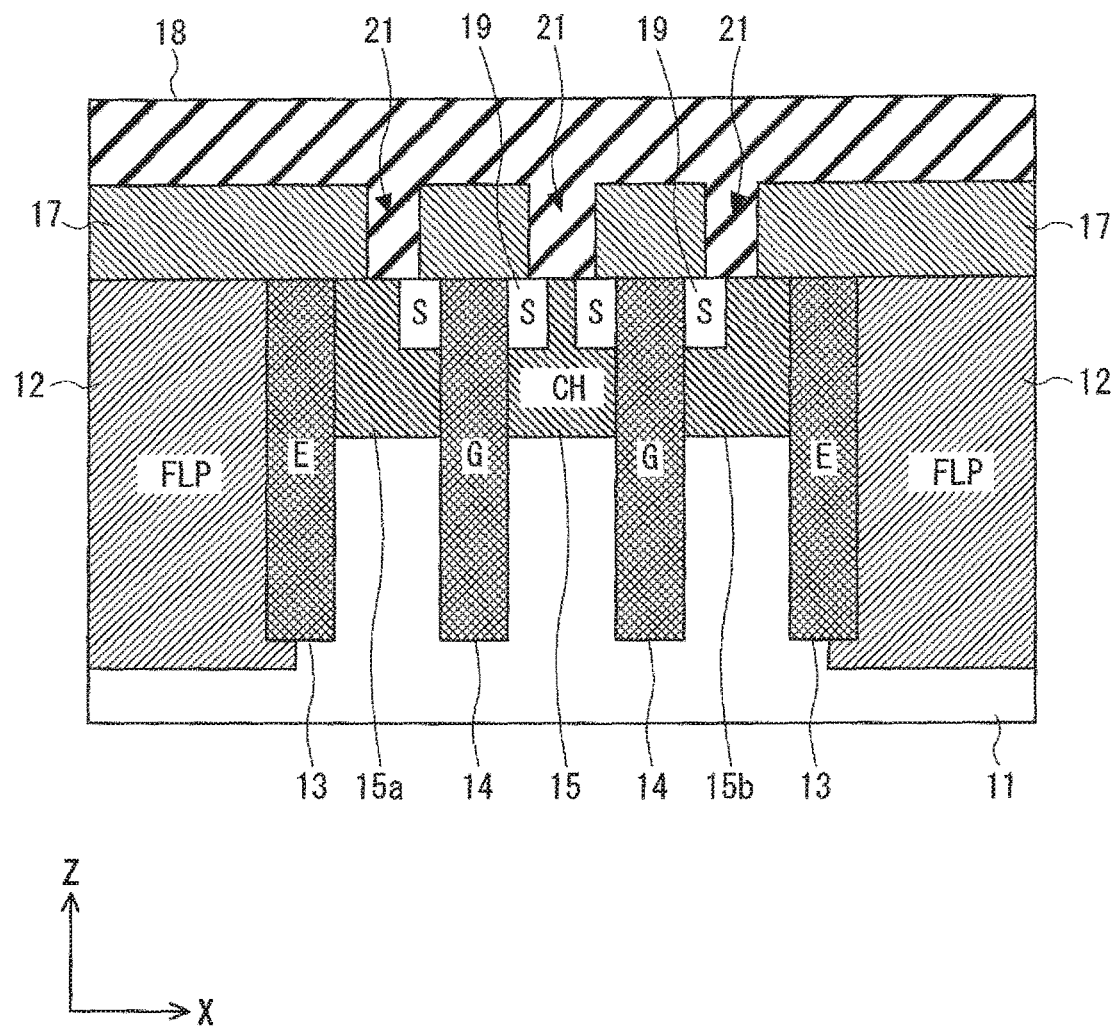
FIG. 3 is a sectional view schematically showing a configuration of an IGBT according to a first modified example.

A trench gate IGBT 1a according to a first modified example of the first embodiment (hereinafter simply referred to as the IGBT 1a) will be described with reference to FIG. 3. FIG. 3 is an XZ sectional view schematically showing the configuration of the IGBT 1a. The basic configuration of the IGBT 1a is similar to that of the IGBT 1 shown in FIGS. 1 and 2, and thus the description thereof is omitted as appropriate. FIG. 3 shows the channel layers 15 that are each disposed between the emitter trench 13 and the gate trench 14 as channel layers 15a and 15b.

The IGBT 1a further includes the source diffusion layers 19 that are each disposed between the emitter trench 13 and the gate trench 14. In the IGBT 1a, the source diffusion layers 19 are provided not only in the region between the two gate trenches 14, but also in the regions between the gate trench 14 and the emitter trench 13. Specifically, the source diffusion layers 19 are formed on the surface of each of the channel layers 15a and 15. In the X-direction, the source diffusion layers 19 are disposed on both sides of one gate trench 14. With this configuration, the source density can be increased and a larger current can be caused to flow. The components other than the source diffusion layer 19 provided between the gate trench 14 and the emitter trench 13 are similar to those of the first embodiment, and thus descriptions thereof are omitted.

In the configuration shown in FIG. 2 according to the first embodiment, the source diffusion layers 19 are not provided in the region between the gate trench 14 and the emitter trench 13. In other words, the source diffusion layers 19 are provided only in the region between two gate trenches 14. In this case, the width of the invalid region between the gate trench 14 and the emitter trench 13 can be reduced. Accordingly, the invalid region can be shrunk and the area thereof can be reduced.

The size of each source diffusion layer 19 may be adjusted depending on a current to be caused to flow. For example, the current can be increased by increasing the area of each source diffusion layer 19, and the current can be decreased by reducing the area of each source diffusion layer 19. A short-circuit current that flows when a load is short-circuited can be decreased by reducing the size of each source diffusion layer 19. A short-circuit tolerance can be adjusted depending on the size of each source diffusion layer 19.

Second Embodiment

Figure 4:
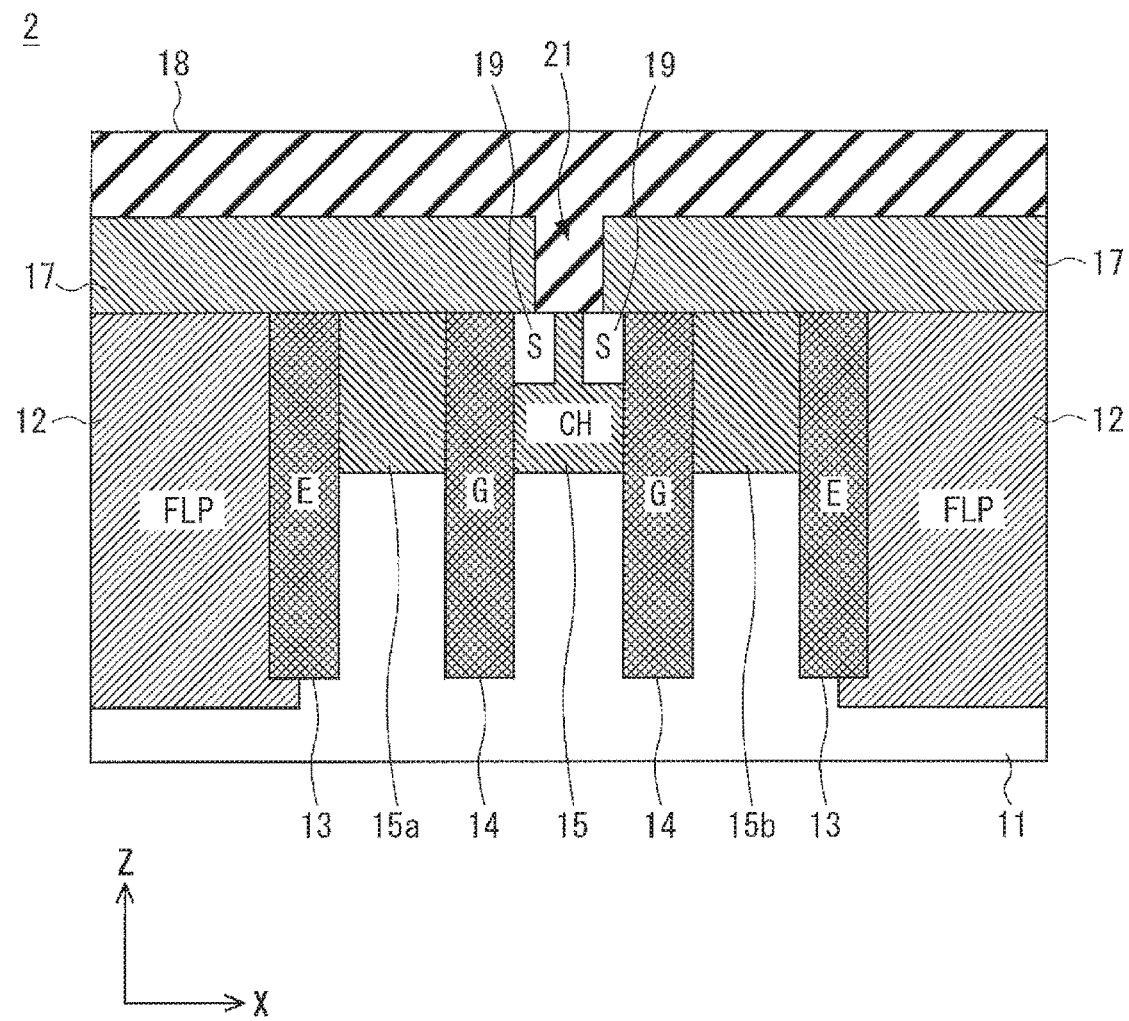
FIG. 4 is a sectional view schematically showing a configuration of an IGBT according to a second embodiment.

A trench gate IGBT 2 according to a second embodiment (hereinafter simply referred to as the IGBT 2) will be described with reference to FIG. 4. FIG. 4 is a sectional view schematically showing the configuration of the IGBT 2. Like FIG. 3, FIG. 4 also shows the channel layers 15, which are each disposed between the emitter trench 13 and the gate trench 14, as the channel layers 15a and 15b.

The arrangement of the contacts 21 formed in the insulating film 17 in the second embodiment is different from that in the first embodiment. The basic configuration of the IGBT 2 according to the second embodiment is similar to that of the IGBT 1 according to the first embodiment, except for the arrangement of the contacts 21, and thus the description thereof is omitted.

In the second embodiment, the contacts 21 are not formed on the channel layers 15a and 15b. In other words, the channel layers 15a and 15b are each covered with the insulating film 17. Accordingly, the channel layers 15a and 15b that are each disposed between the emitter trench 13 and the gate trench 14 are floating.

The configuration in which the channel layers 15a and 15b are floating prevents stored carriers (holes) from being absorbed in the contacts. Consequently, the storage effect is enhanced and the collector-emitter voltage Vce (sat) and be reduced.

Third Embodiment

Figure 5:
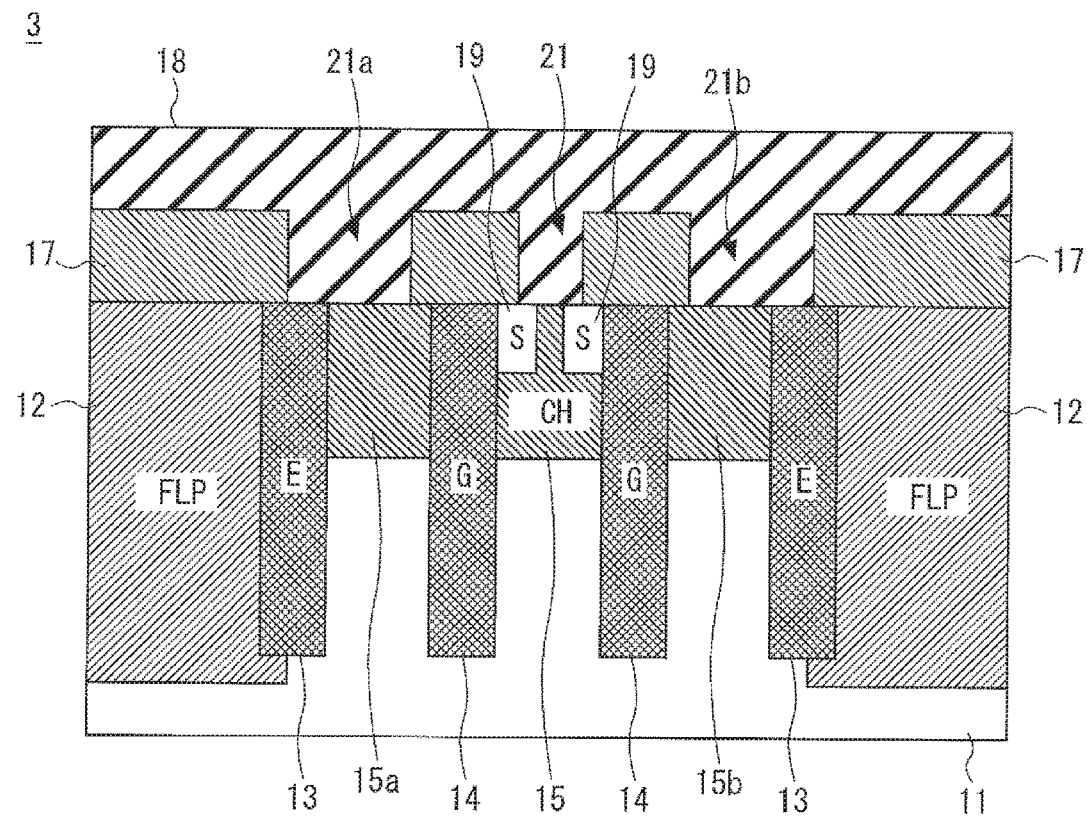
FIG. 5 is a sectional view schematically showing a configuration of an IGBT according to a third embodiment.

An IGBT 3 according to a third embodiment will be described with reference to FIG. 5. FIG. 5 is a sectional view schematically showing the configuration of the IGBT 3. The third embodiment differs from the first embodiment in regard to the arrangement of the contacts 21 provided in the insulating film 17. The basic configuration of the IGBT 3 according to the third embodiment is similar to the IGBT according to the first embodiment, except for the arrangement of the contacts 21, and thus the description thereof is omitted.

Like FIGS. 3 and 4, FIG. 5 also shows the channel layers 15 that are each disposed between the emitter trench 13 and the gate trench 14 as the channel layers 15a and 15b. FIG. 5 also shows the contact 21 formed on the channel layer 15a as a contact 21a, and the contact 21 formed on the channel layer 15b as a contact 21b.

The contact 21a extends from an upper part of the emitter trench 13 to an upper part of the channel layer 15a. In other words, the contact 21a straddles the boundary between the emitter trench 13 and the channel layer 15a. The contact 21b extends from an upper part of the emitter trench 13 to an upper part of the channel layer 15b. In other words, the contact 21a straddles the boundary between the emitter trench 13 and the channel layer 15a.

With this configuration, the distance of an invalid region from the emitter trench 13 to the gate trench can be reduced. Accordingly, the invalid region can be shrunk and the area thereof can be reduced.

For example, in the semiconductor devices according to the embodiments described above, the conductivity type (p-type or n-type) of the semiconductor substrate, a semiconductor layer, a diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

While the invention made by the present inventors has been described in detail above with reference to embodiments, the present invention is not limited to the embodiments described above and can be modified in various ways without departing from the scope of the invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A trench gate insulated gate bipolar transistor (IGBT) comprising:
   a substrate;

a first-conductivity-type channel layer provided on the substrate;

two first-conductivity-type floating layers, such that one floating layer is provided on each side of both sides of the channel layer, the first-conductivity-type floating layers being deeper than the channel layer;

two emitter trenches disposed between the two floating layers, the emitter trenches being respectively in contact with the floating layers;

at least two gate trenches disposed between the two emitter trenches;

a source diffusion layer disposed between the two gate trenches, the source diffusion layer being in contact with each of the gate trenches; and an insulation film on a top surface of the channel layer, the two floating layers, the two emitter trenches, each of the at least two gate trenches, and the source diffusion layer, wherein the insulation film has a plurality of via holes to provide a contact to the top surface of the channel layer, including a first via hole for contact to the channel layer between each of the at least two gate trenches, a second via hole for contact to the channel layer between a first of the two gate trenches and a first of the two emitter trenches, and a third via hole for contact to the channel layer between a second of the two gate trenches and a second of the two emitter trenches.

2. The trench gate IGBT according to claim 1, wherein the source diffusion layer is not disposed between the emitter trench and the gate trench.

3. The trench gate IGBT according to claim 1, further comprising a source diffusion layer disposed between the emitter trench and the gate trench.

4. The trench gate IGBT according to claim 1, wherein the channel layer disposed between the gate trench and the emitter trench is floating.

5. The trench gate IGBT according to claim 1, wherein the contact extends from an upper part of the emitter trench to an upper part of the channel layer between the emitter trench and the gate trench.

6. The trench gate IGBT according to claim 1, wherein the floating layer is formed to be deeper than the emitter trench.

7. The trench gate IGBT according to claim 1, further comprising an emitter electrode on a top surface of the insulation film, wherein the contact to the top surface of the channel layer comprises a contact of the emitter electrode to the channel layer.

8. The trench gate IGBT according to claim 1, wherein, in a plan view, each floating layer is formed in a rectangular shape and an emitter trench respectively associated with each floating layer is formed in a U-shape in contact with three sides of its associated floating layer.

9. A trench gate insulated gate bipolar transistor (IGBT) comprising:
a substrate;
a first-conductivity-type channel layer provided on the substrate;
a first first-conductivity-type floating layer provided on a first side of the channel layer;
a second first-conductivity-type floating layer provided on a second side of the channel layer opposite the first side;
a first emitter trench disposed in the channel layer between the first first-conductivity-type floating layer and the first side of the channel layer, the first emitter trench contacting both the first floating layer and the first side of the channel layer;
a second emitter trench disposed in the channel layer between the second first-conductivity-type floating layer and the second side of the channel layer, the second emitter trench contacting both the second floating layer and second side of the channel layer;
a first gate trench and a second gate trench disposed in the channel layer between the first and second emitter trenches;
a first source diffusion region and a second source diffusion region disposed in the channel layer between the first and second gate trenches, the first source diffusion region being in contact with the first gate trench and the second source diffusion region being in contact with the second gate trench;
an insulation film on a top surface of the channel layer, the first and second floating layers, the first and second emitter trenches, the first and second gate trenches, and the first and second source diffusion regions; and
an emitter electrode on a top surface of the insulation film, wherein the first and second floating layers are deeper than the channel layer, and
wherein the insulation film has a plurality of via holes to provide a contact of the emitter electrode to the top surface of the channel layer, including a first via hole for contact to the channel layer between each of the two gate trenches, a second via hole for contact to the channel layer between a first gate trench and the first emitter trench, and a third via hole for contact to the channel layer between the second gate trench and the second emitter trench Contact.

10. The trench gate IGBT according to claim 9, wherein no source diffusion region is disposed between the first emitter trench and the first gate trench or between the second emitter trench and the second gate trench.

11. The trench gate IGBT according to claim 9, wherein third source diffusion region is disposed between the first emitter trench and the first gate trench and a fourth source diffusion region is disposed between the second emitter trench and the second gate trench.

12. The trench gate IGBT according to claim 9, wherein the channel layer disposed between the gate trench and the emitter trench is floating.

13. The trench gate IGBT according to claim 9, wherein, for each of the first and second emitter trenches, the emitter electrode contacts both a portion of the upper surface of the emitter trench and a portion of the upper surface of the channel layer between the emitter trench and an associated gate trench.

14. The trench gate IGBT according to claim 9, wherein the first and second floating layers are formed to be deeper than the first and second emitter trenches.

15. The trench gate IGBT according to claim 9, wherein, in a plan view, each of the first and second floating layers is formed in a rectangular shape and each of the first and second emitter trenches, respectively associated with the first and second floating layer, is formed in a U-shape in contact with three sides of its associated floating layer.

* * * * *